(12) United States Patent
Lin et al.

(10) Patent No.: US 10,002,780 B2
(45) Date of Patent: Jun. 19, 2018

(54) METHOD OF MANUFACTURING A SEMICONDUCTOR STRUCTURE

(71) Applicant: TAIWAN SEMICONDUCTOR MANUFACTURING COMPANY LTD., Hsinchu (TW)

(72) Inventors: Su-Horng Lin, Hsinchu (TW); Victor Y. Lu, Foster City, CA (US); Tsung-Hsi Yang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 15/156,908

(22) Filed: May 17, 2016

(65) Prior Publication Data

US 2017/0338138 A1 Nov. 23, 2017

(51) Int. Cl.
*H01L 21/67* (2006.01)
*H01L 21/673* (2006.01)
*H01L 21/02* (2006.01)

(52) U.S. Cl.
CPC .... *H01L 21/67393* (2013.01); *H01L 21/0262* (2013.01); *H01L 21/02532* (2013.01); *H01L 21/02653* (2013.01)

(58) Field of Classification Search
CPC ........... H01L 21/0262; H01L 21/02631; H01L 21/02617; H01L 21/02636; H01L 21/67248
See application file for complete search history.

(56) References Cited

U.S. PATENT DOCUMENTS

| 5,037,774 | A  | * | 8/1991 | Yamawaki | ............ | H01L 21/324 117/8 |
| 2003/0119283 | A1 | * | 6/2003 | Ishibashi | ............. | C23C 16/4412 438/478 |
| 2004/0007185 | A1 | * | 1/2004 | Moriya | ................... | C23C 16/30 118/724 |
| 2006/0046459 | A1 | * | 3/2006 | Ramaswamy | ...... | H01L 21/0237 438/607 |
| 2006/0113542 | A1 | * | 6/2006 | Isaacson | ............. | H01L 21/0237 257/65 |
| 2007/0128836 | A1 | * | 6/2007 | Nogami | ............ | H01L 21/02063 438/478 |
| 2014/0361308 | A1 | * | 12/2014 | Yui | ..................... | H01L 21/0254 257/76 |
| 2015/0162186 | A1 | * | 6/2015 | Kohler | ................ | H01L 21/0254 438/478 |

* cited by examiner

*Primary Examiner* — Julia Slutsker
(74) *Attorney, Agent, or Firm* — WPAT, P.C., Intellectual Property Attorneys; Anthony King

(57) ABSTRACT

A method of manufacturing a semiconductor structure includes providing a substrate, disposing a first semiconductive material over the substrate at a first temperature, disposing a second semiconductive material over the first semiconductive material at a second temperature, and disposing a third semiconductive material over the second semiconductive material at a third temperature, wherein a first interval between the first temperature and the second temperature is substantially same as a second interval between the second temperature and the third temperature.

19 Claims, 9 Drawing Sheets

METHOD OF MANUFACTURING A SEMICONDUCTOR STRUCTURE

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductive components are assembled on the semiconductor device. Numerous manufacturing operations are implemented within such a small semiconductor device.

The manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components or other issues, resulting in a high yield loss of the semiconductor device. The semiconductor device is produced in an undesired configuration, which would further exacerbate materials wastage and thus increase the manufacturing cost.

The semiconductor device is assembled with numbers of integrated components. Since more different components are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
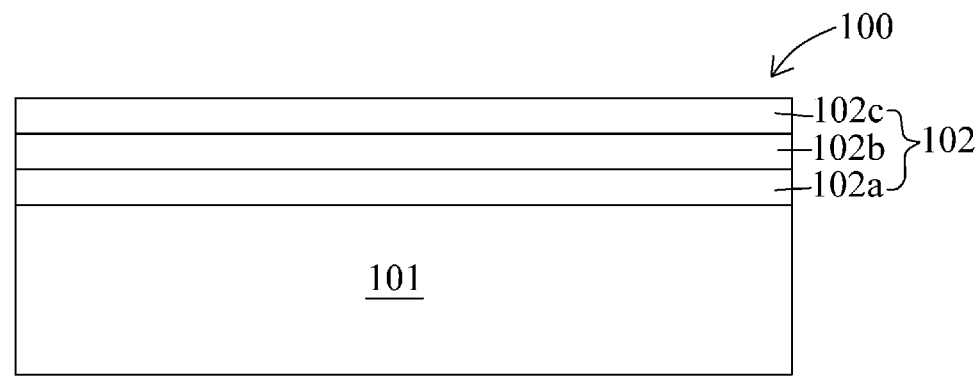
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a semiconductive substrate is provided, and a single crystal layer of a semiconductive material is deposited or grown over a surface of the semiconductive substrate. An epitaxial (EPI) layer is formed over the semiconductive substrate by epitaxy operations in a chamber of an epitaxial reactor. Integrated circuits or components are then formed in the epitaxial layer on the semiconductive substrate. As such, quality and stability of EPI layer is essential to a performance of the semiconductor structure.

The growth of EPI layer is closely monitored during the epitaxy operations. A uniformity of thickness of EPI layer is difficult to control. Since the uniformity can be affected by temperature, temperature applied to the semiconductive substrate during the epitaxy operations would be adjusted in order to obtain a stable EPI layer with uniform thickness across the semiconductive substrate. For example, a thickness of the EPI layer is measured every 4 processing days, and the temperature applied to the semiconductive substrate or temperature of the chamber of the epitaxial reactor is tuned accordingly. However, the measurement of the thickness of the EPI layer would occasionally interrupt the epitaxy operations. Such interruption would increase manufacturing time and cost, lower throughput (a number of semiconductive substrates cycled through the epitaxy operations in the epitaxial reactor), increase unit cost, etc.

Furthermore, dome coating may be developed over the EPI layer during the epitaxial operations. The dome coating would affect accuracy of the temperature measurement. Since the adjustment of the processing temperature is based upon the temperature measure, the inaccurate temperature measurement would adversely affect the processing temperature adjustment. As a result, the adjustment of the processing temperature may not achieve a stable EPI layer with uniform thickness as desired.

In the present disclosure, a method of manufacturing a semiconductor structure is disclosed. The method includes disposing semiconductive material over a substrate with periodical adjustment of temperature. The semiconductive material is disposed at a certain temperature over a certain period of time. The temperature would be constantly adjusted at an interval after a period of time. For example, the temperature would be increased about 0.1° C. every 6 days. Such periodical adjustment of temperature would result in the semiconductive material disposed in a uniform thickness over the substrate, and a stable epitaxial layer is formed over the substrate. A reliability and performance of the semiconductor structure is improved. Further, the manufacturing of the semiconductor structure would not be interrupted and thus can proceed continuously.

FIG. 1 is a schematic cross sectional view of a semiconductor structure 100 in accordance with various embodiments of the present disclosure. In some embodiments, the semiconductor structure 100 includes a substrate 101 and an epitaxial layer 102 disposed over the substrate 101. In some embodiments, the epitaxial layer 102 includes several layers of semiconductive material stacking over each other.

In some embodiments, the substrate 101 includes semiconductive material such as silicon, etc. In some embodiments, the substrate 101 is a silicon substrate or a silicon wafer. In some embodiments, the substrate 101 is configured for growing the epitaxial layer 102 thereon. In some embodiments, the substrate 101 is a single crystal base, and the epitaxial layer 102 can be grown over the substrate 101. In some embodiments, the substrate 101 is in a circular shape or any other suitable shapes. In some embodiments, the substrate 101 has a diameter and a thickness conforming prescribed standards. It will be appreciated that the substrate 101 can have a different diameter or a different thickness.

In some embodiments, the epitaxial layer 102 includes semiconductive material such as silicon, etc. In some embodiments, the epitaxial layer 102 includes same material as the substrate 101. In some embodiments, the epitaxial layer 102 includes a first semiconductive material 102a, a second semiconductive material 102b and a third semiconductive material 102c. In some embodiments, the first semiconductive material 102a is a first epitaxial layer or a first silicon epitaxial layer. In some embodiments, the second semiconductive material 102b is a second epitaxial layer or a second silicon epitaxial layer. In some embodiments, the third semiconductive material 102c is a third epitaxial layer or a third silicon epitaxial layer. In some embodiments, the first semiconductive material 102a is disposed over the substrate 101, the second semiconductive material 102b is disposed over the first semiconductive material 102a, and the third semiconductive material 102c is disposed over the second semiconductive material 102b.

In some embodiments, the first semiconductive material 102a, the second semiconductive material 102b and the third semiconductive material 102c include same material as or different material from each other. In some embodiments, a first thickness of the first semiconductive material 102a, a second thickness of the second semiconductive material 102b and a third thickness of the third semiconductive material 102c are substantially same as each other.

Figure 2:
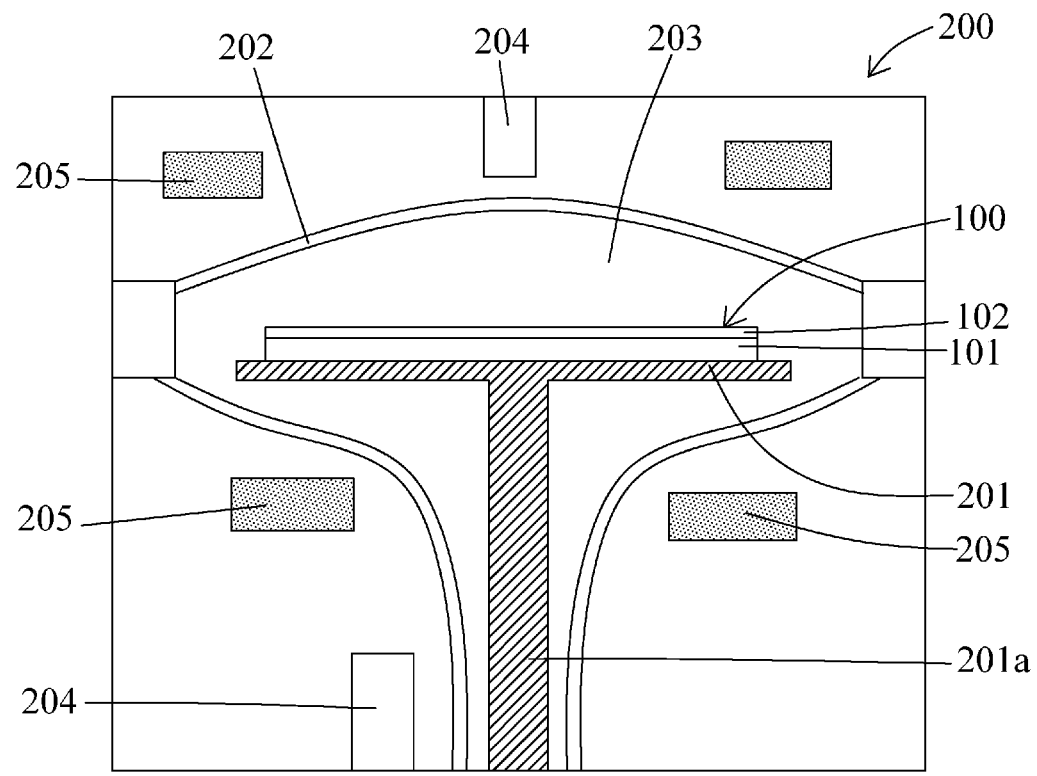
FIG. 2 is a schematic cross sectional view of a semiconductor structure disposed in a processing chamber in accordance with some embodiments of the present disclosure.

FIG. 2 is a schematic cross sectional view of a processing chamber 200 for manufacturing the semiconductor structure 100 in accordance with various embodiments of the present disclosure. In some embodiments, the processing chamber 200 is configured for performing epitaxy operations. In some embodiments, the processing chamber 200 is an epitaxy reactor. In some embodiments, the processing chamber 200 is configured for disposing the epitaxial layer 102 over the substrate 101.

In some embodiments, the processing chamber 200 includes a supporting base 201, a cover 202, a chamber 203 and a pyrometer 204. In some embodiments, the supporting base 201 is configured to support the substrate 101 or the semiconductor structure 100 thereon. In some embodiments, the supporting base 201 is in a circular shape. In some embodiments, the supporting base 201 has a width or diameter substantially greater than a width of diameter of the substrate 101. In some embodiments, the supporting base 201 is rotatable about an axis, a central axis of the supporting base 201 or a shaft 201a. In some embodiments, the supporting base 201 is a susceptor. In some embodiments, the substrate 101 is supported by the supporting base 201 and is rotated about the shaft 201a during the epitaxy operations or the disposing of the epitaxial layer 102 over the substrate 101. In some embodiments, the supporting base 201 includes silicon carbide, graphite, etc.

In some embodiments, the cover 202 surrounds the supporting base 201 and the substrate 101 (or the semiconductor structure 100) disposed over the supporting base 201. In some embodiments, the cover 202 includes an optically transparent material such as quartz, etc. In some embodiments, the supporting base 201 and the substrate 101 are substantially enclosed by the cover 202. In some embodiments, the cover 202 defines the chamber 203. In some embodiments, the supporting base 201 and the substrate 101 (or the semiconductor structure 100) are disposed inside the chamber 203.

In some embodiments, the substrate 101 is disposed inside the chamber 203 and is maintained at a certain temperature during the epitaxy operations. In some embodiments, the substrate 101 is maintained at the certain temperature by radiation emitted from the supporting base 201, radiation emitted from a source 205 (for example, an infra red source, a tungsten lamp, halogen lamp, etc.) and transmitted through the cover 202, or etc. In some embodiments, the substrate 101 is maintained at the certain temperature by maintaining the chamber 203 at another certain temperature.

Figure 3:
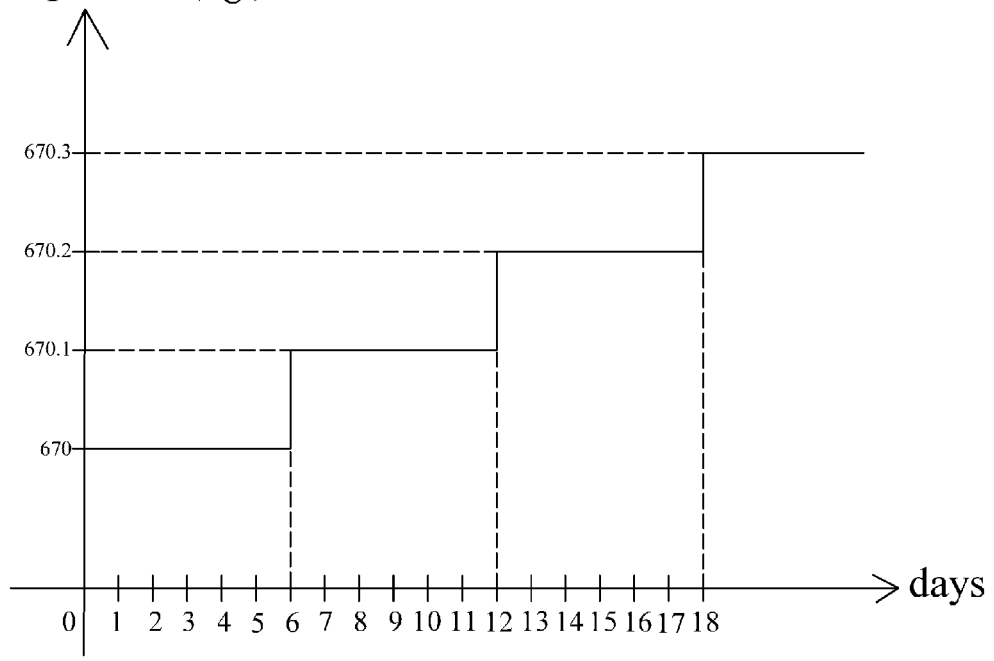
FIG. 3 is a graph showing a relationship between a temperature and a duration (days) for epitaxy operations in accordance with some embodiments of the present disclosure.
Figure 4:
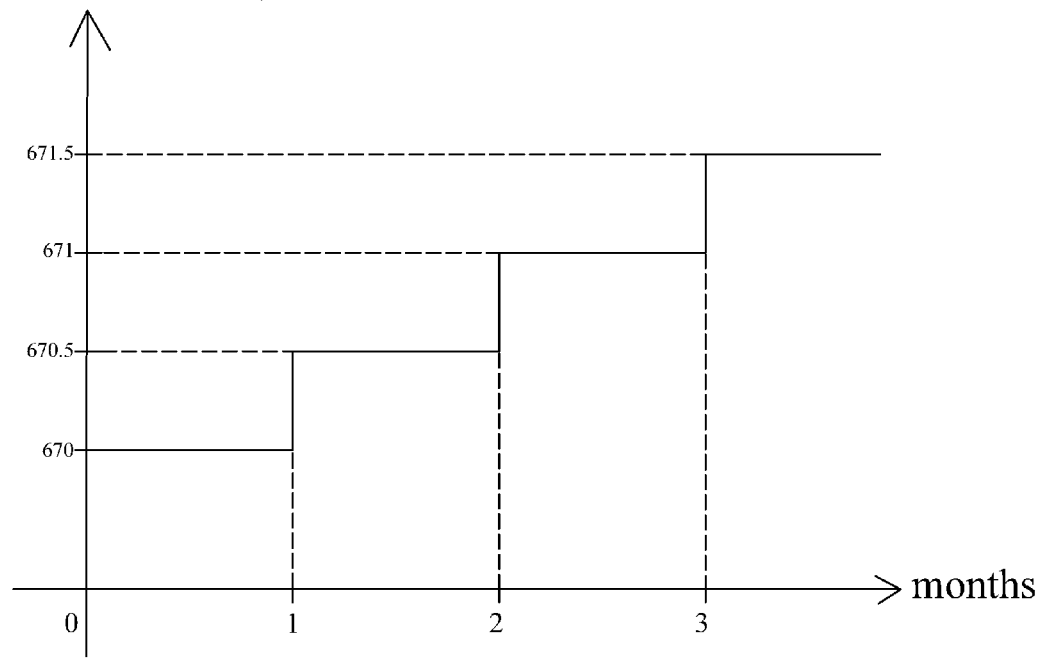
FIG. 4 is a graph showing a relationship between a temperature and a duration (months) for epitaxy operations in accordance with some embodiments of the present disclosure.

In some embodiments, the temperature of the substrate 101 or the temperature of the semiconductor structure 100 is adjusted periodically. In some embodiments, the temperature of the substrate 101 or the temperature of the semiconductor structure 100 is adjusted by adjusting the radiation from the supporting base 201, the radiation from the source 205, the temperature of the chamber 204, etc. In some embodiments, the temperature of the substrate 101 or the temperature of the semiconductor structure 100 is constantly increased at an interval in a period of time. For example, the temperature of the substrate 101 or the temperature of the semiconductor structure 100 would be increased about 0.1° C. every 6 days as illustrated in FIG. 3 or would be constantly increased about 1.5° C. within 3 months as illustrated in FIG. 4. Such constant adjustment of temperature allows continuous epitaxy operations. The epitaxy operations would not be interrupted.

In some embodiments, the temperature of the substrate 101 or the temperature of the semiconductor structure 100 can be measured by the pyrometer 204. In some embodiments, the pyrometer 204 is configured to obtain the temperature of the substrate 101 or the temperature of the semiconductor structure 100 by sensing a radiation emitted from the substrate 101 or the semiconductor structure 100.

Figure 5:
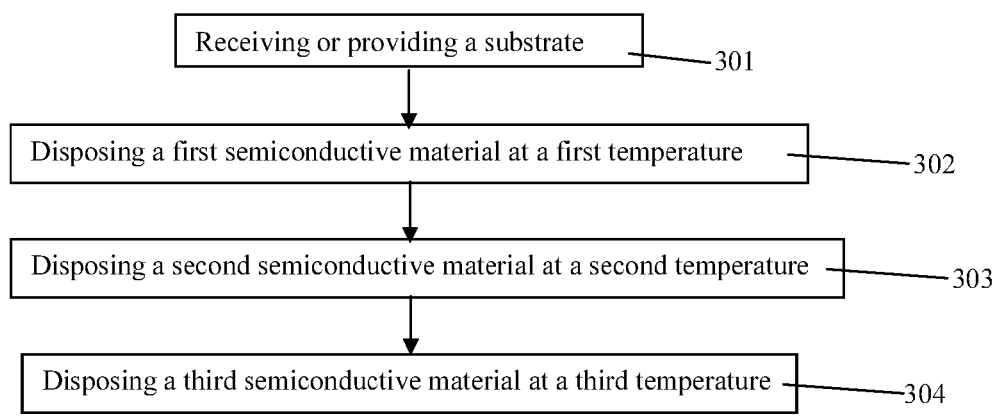
FIG. 5 is a flow diagram of a method of manufacturing a semiconductor structure in accordance with some embodiments of the present disclosure.

In the present disclosure, a method of manufacturing a semiconductor structure 100 is disclosed. In some embodiments, a semiconductor structure 100 is formed by a method 300. The method 300 includes a number of operations and the description and illustration are not deemed as a limitation as the sequence of the operations. FIG. 5 is an embodiment of a method 300 of manufacturing a semiconductor structure 100. The method 300 includes a number of operations (301, 302, 303 and 304).

Figure 5A:
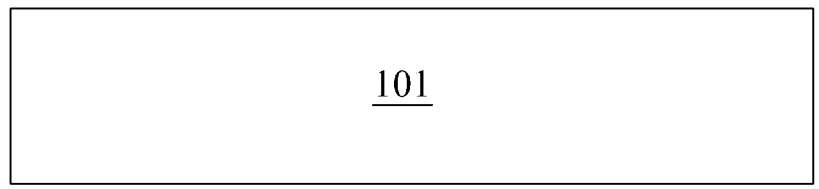
FIGS. 5A-5K are schematic views of manufacturing a semiconductor structure by a method of FIG. 5 in accordance with some embodiments of the present disclosure.
Figure 5B:
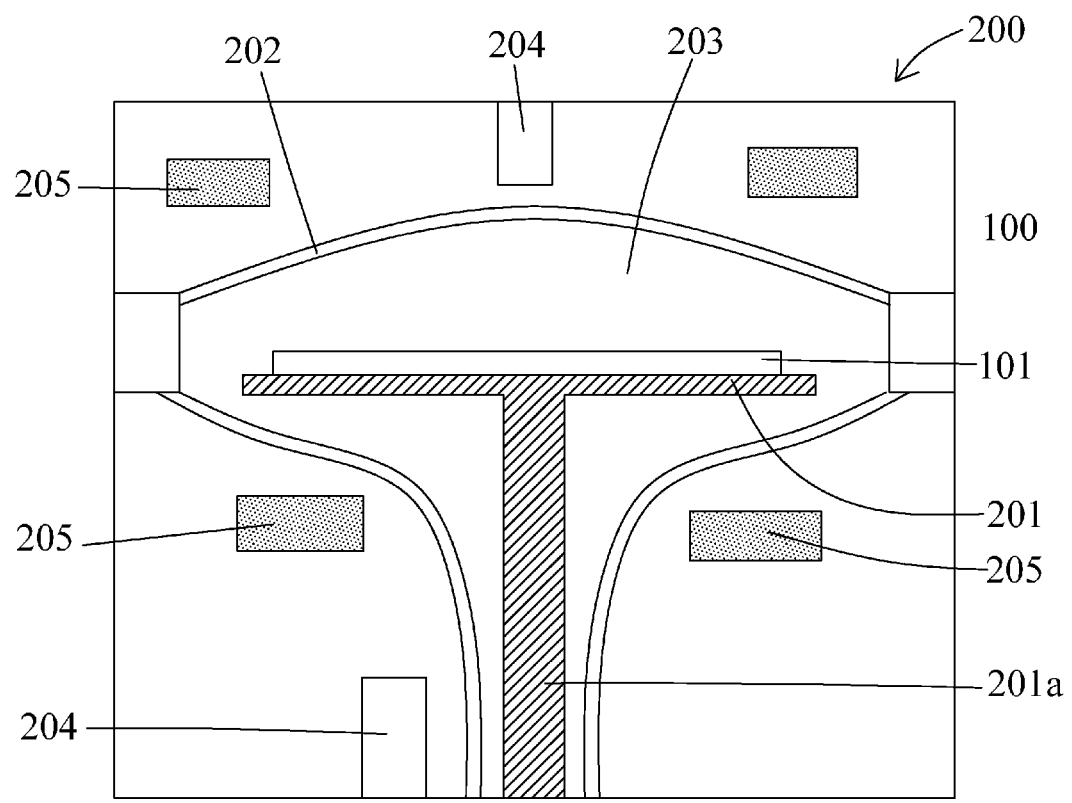

In operation 301, a substrate 101 is provided or received as shown in FIGS. 5A and 5B. FIG. 5A is an enlarged view of the substrate 101 in FIG. 5B. In some embodiments, the substrate 101 is disposed inside a chamber 203 of a processing chamber 200 as shown in FIG. 5B. In some embodiments, the substrate 101 is disposed on a supporting base 201 of the processing chamber 200. In some embodiments, the substrate 101 includes semiconductive material such as silicon, etc. In some embodiments, the substrate 101 is a silicon substrate. In some embodiments, the substrate 101 has similar configuration as described above or illustrated in FIG. 1 or 2.

In some embodiments, a temperature of the substrate 101 is adjusted periodically during subsequent deposition of semiconductive materials over the substrate 101. In some embodiments, the periodical temperature adjustment is derived from an initial observation. In some embodiments, the initial observation includes disposing the semiconductive material over the substrate 101 at a predetermined temperature for a predetermined duration and then measuring a deviation of total thickness of the substrate 101 and the semiconductive material across the substrate 101. In some embodiments, the periodical temperature adjustment is based upon the initial observation. For example, according to the initial observation, the deviation of the total thickness is less than 2 Å as desired when the temperature of the substrate 101 is increased about 0.1° C. every 6 days or constantly increased about 1.5° C. within 3 months. In some embodiments, the periodical temperature adjustment derived from the initial observation would be implemented during subsequent deposition of semiconductive materials over the substrate 101. In some embodiments, the subsequent deposition of semiconductive materials would be performed continuously without interruption (for example, offline measurement of the deviation of the total thickness, etc.)

Figure 5C:
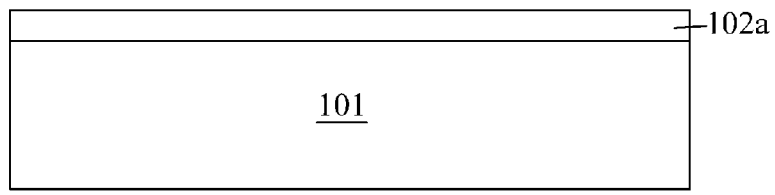
Figure 5D:
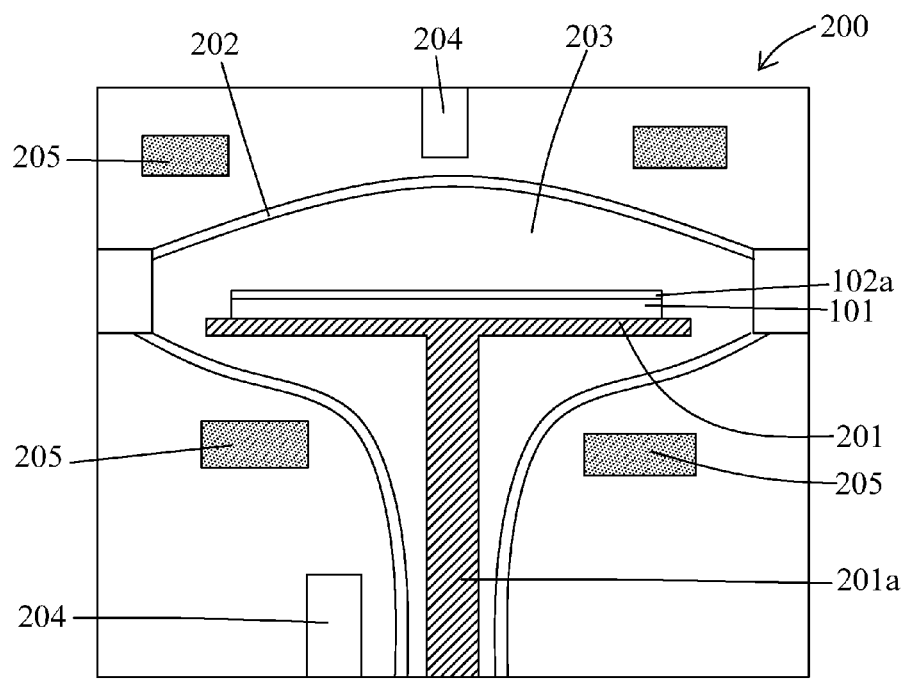
Figure 5E:
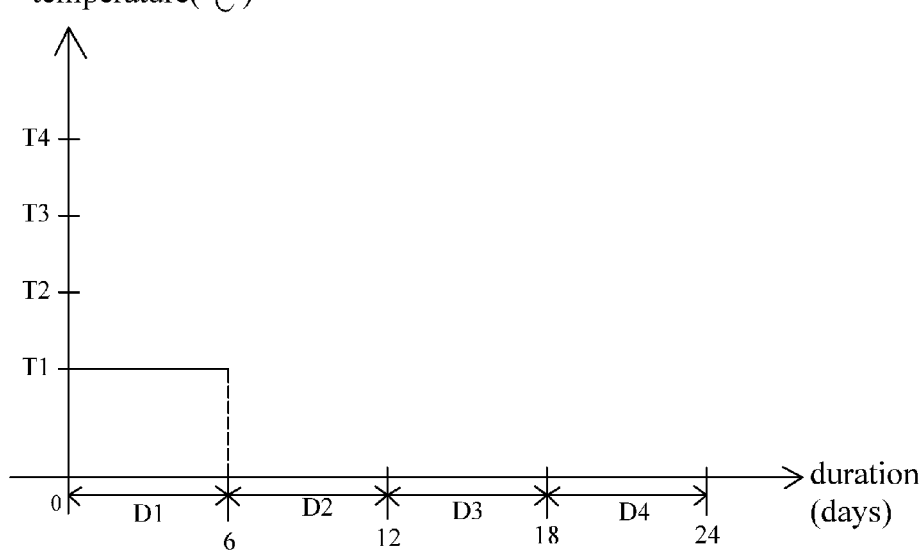

In operation 302, a first semiconductive material 102a is disposed over the substrate 101 at a first temperature T1 as shown in FIGS. 5C-5E. FIG. 5C is an enlarged view of the substrate 101 and the first semiconductive material 102a in FIG. 5D. FIG. 5E is a graph showing the first temperature T1 is maintained within a certain period of time during the disposing of the first semiconductive material 102a. In some embodiments, the first semiconductive material 102a is grown over the substrate 101 at the first temperature T1. In some embodiments, the substrate 101 is adjusted to the first temperature T1, and then the first semiconductive material 102a is grown over the substrate 101 at the first temperature T1. In some embodiments, the first semiconductive material 102a is disposed by any suitable operations such as vapor phase epitaxy (VPE), chemical vapor deposition (CVD), etc.

In some embodiments, the first semiconductive material 102a includes silicon. In some embodiments, the first semiconductive material 102a is a first epitaxial layer or a first silicon epitaxial layer. In some embodiments, the first semiconductive material 102a has similar configuration as described above or illustrated in FIG. 1 or 2.

In some embodiments, the first semiconductive material 102a is grown over the substrate 101 at the first temperature T1. In some embodiments, the substrate 101 is adjusted to the first temperature T1, and then the first semiconductive material 102a is grown over the substrate 101 at the first temperature T1. In some embodiments, the first temperature T1 is arrived by adjusting a source 205 of the processing chamber 200. In some embodiments, the first temperature T1 is about 500° C. to 1000° C. In some embodiments, the first temperature T1 is of about 650° C. to 700° C. In some embodiments, the first temperature T1 is about 670° C.

In some embodiments, the first semiconductive material 102a is disposed over the substrate 101 at the first temperature T1 for a first duration D1. In some embodiments, the disposing of the first semiconductive material 102a at the first temperature T1 lasts for the first duration D1. In some embodiments, the substrate 101 is adjusted to the first temperature T1, and then the first semiconductive material 102a is grown over the substrate 101 at the first temperature T1 for the first duration D1. In some embodiments, the first semiconductive material 102a is formed over the substrate 101 at the first temperature T1 after the first duration D1. In some embodiments, the first duration D1 is about 3 days to 10 days. In some embodiments, the first duration D1 is about 6 days as shown in FIG. 5E.

Figure 5F:
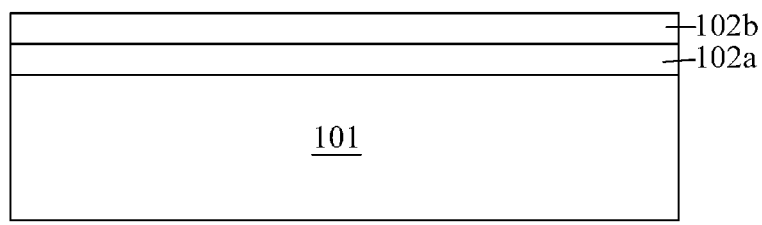
Figure 5G:
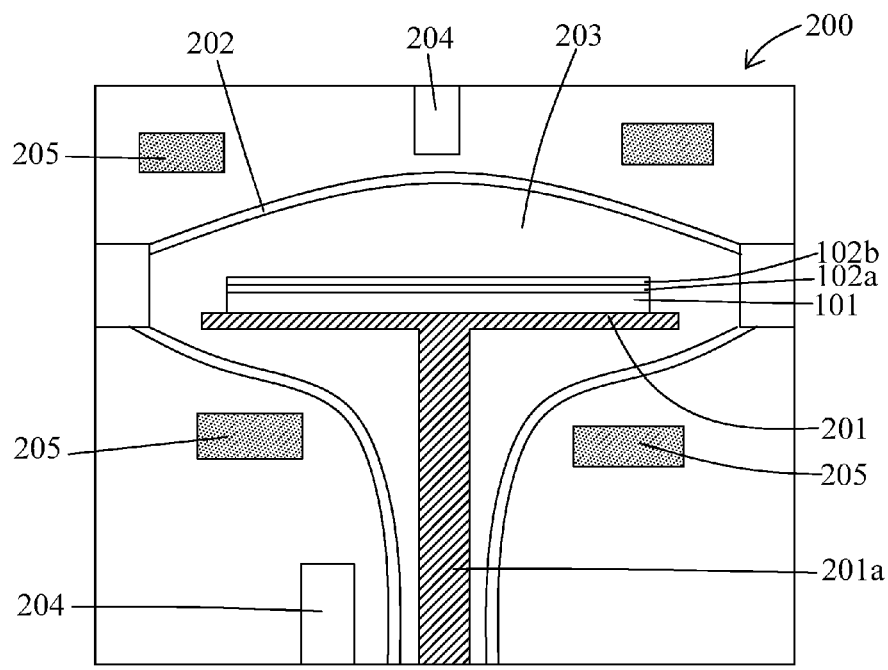
Figure 5H:
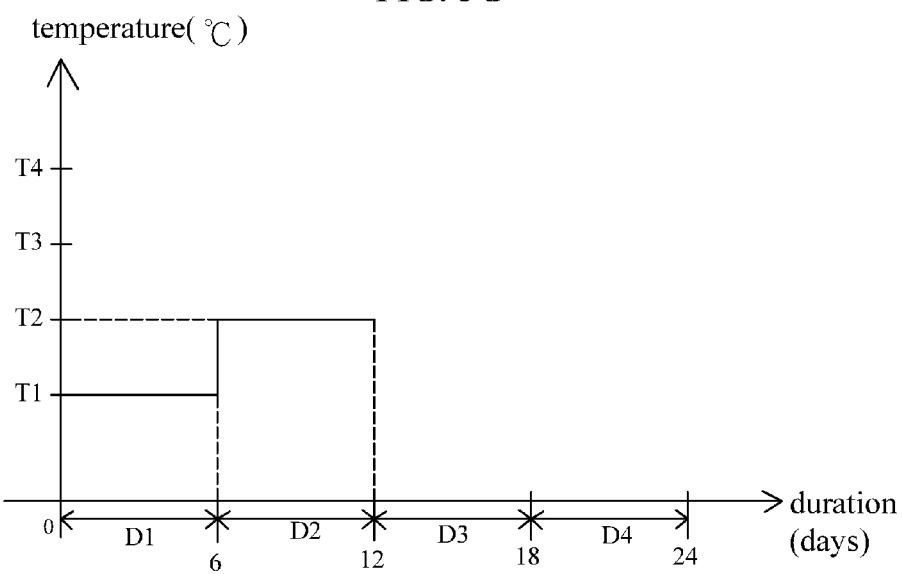

In operation 303, a second semiconductive material 102b is disposed over the first semiconductive material 102a at a second temperature T2 as shown in FIGS. 5F-5H. FIG. 5F is an enlarged view of the substrate 101, the first semiconductive material 102a and the second semiconductive material 102b in FIG. 5G. FIG. 5H is a graph showing the second temperature T2 is maintained within a certain period of time during the disposing of the second semiconductive material 102b. In some embodiments, the second semiconductive material 102b is grown over the first semiconductive material 102a at the second temperature T2. In some embodiments, the substrate 101 or the first semiconductive material 102a is adjusted to the second temperature T2, and then the second semiconductive material 102b is grown over the first semiconductive material 102a at the second temperature T2. In some embodiments, the disposing or growing of the first semiconductive material 102a is immediately followed by the disposing or growing of the second semiconductive material 102b. In some embodiments, the second semiconductive material 102b is disposed by any suitable operations such as VPE, CVD, etc.

In some embodiments, the second semiconductive material 102b includes silicon. In some embodiments, the second semiconductive material 102b is a second epitaxial layer or a second silicon epitaxial layer. In some embodiments, the second semiconductive material 102b includes same material as the first semiconductive material 102a. In some embodiments, a growth rate of the first semiconductive material 102a is substantially same as a growth rate of the second semiconductive material 102b. In some embodiments, a first thickness of the first semiconductive material 102a is substantially same as a second thickness of the second semiconductive material 102b. In some embodiments, a deviation of a total thickness of the substrate 101, the first semiconductive material 102a and the second semiconductive material 102b across the substrate 101 is less than about 2 Å (Angstrom). In some embodiments, the total thickness of the substrate 101, the first semiconductive material 102a and the second semiconductive material 102b is uniform over the substrate 101. In some embodiments, the second semiconductive material 102b has similar configuration as described above or illustrated in FIG. 1 or 2.

In some embodiments, the second semiconductive material 102b is grown over the first semiconductive material 102a at the second temperature T2. In some embodiments, the substrate 101 or the first semiconductive material 102a is adjusted from the first temperature T1 to the second temperature T2, and then the second semiconductive material 102b is grown over the first semiconductive material 102a at the second temperature T2. In some embodiments, the first temperature T1 is adjusted to the second temperature T2, and then the second semiconductive material 102b is disposed over the first semiconductive material 102a at the second temperature T2. In some embodiments, the second temperature T2 is arrived by adjusting the source 205 of the processing chamber 200. In some embodiments, the first temperature T1 is adjusted to the second temperature T2 by increasing or decreasing a temperature of about 0.01° C. to about 0.5° C. In some embodiments, the first temperature T1 is adjusted to the second temperature T2 by increasing or decreasing a temperature of about 0.1° C. In some embodiments, a first interval between the first temperature T1 and the second temperature T2 is about 0.01° C. to about 0.5° C. In some embodiments, the first interval between the first temperature T1 and the second temperature T2 is about 0.1° C.

In some embodiments, the second temperature T2 is substantially greater than the first temperature T1. For example as shown in FIG. 3 or 5H, the first temperature T1 is about 670° C., and the second temperature T2 is about 670.1° C. The first temperature T1 is increased from about 670° C. to the second temperature T2 of about 670.1° C. For example as shown in FIG. 4, the first temperature T1 is about 670° C., and the second temperature T2 is about 670.5° C. The first temperature T1 is increased from 670° C. to the second temperature T2 of about 670.5° C.

In some embodiments, the second semiconductive material 102b is disposed over the first semiconductive material 102a at the second temperature T2 for a second duration D2. In some embodiments, the disposing of the second semiconductive material 102b at the second temperature T2 lasts for the second duration D2. In some embodiments, the substrate 101 or the first semiconductive material 102a is adjusted from the first temperature T1 to the second temperature T2, and then the second semiconductive material 102b is grown over the first semiconductive material 102a at the second temperature T2 for the second duration D2. In some embodiments, the second semiconductive material 102b is formed over the first semiconductive material 102a at the second temperature T2 after the first duration D1.

In some embodiments, the second duration D2 is about 3 days to 10 days. In some embodiments, the second duration D2 is about 6 days. In some embodiments, the first duration D1 is substantially same as the second duration D2. For example as shown in FIG. 3 or 5H, the first semiconductive material 102a is disposed for 6 days, and the second semiconductive material 102b is also disposed for 6 days. For example as shown in FIG. 4, the first semiconductive material 102a is disposed for 1 month, and the second semiconductive material 102b is also disposed for 1 month. In some embodiments, the second duration D2 is immediately after the first duration D1.

Figure 5I:
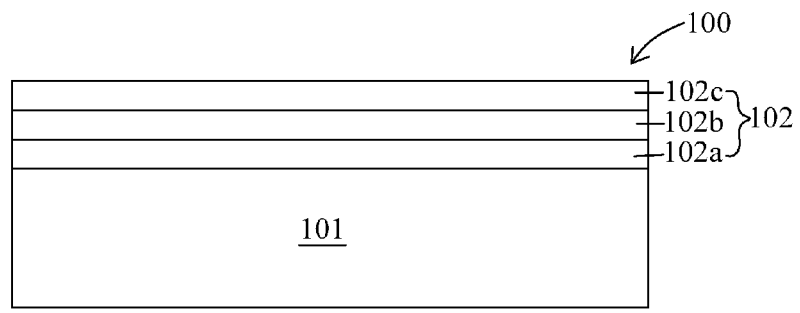
Figure 5J:
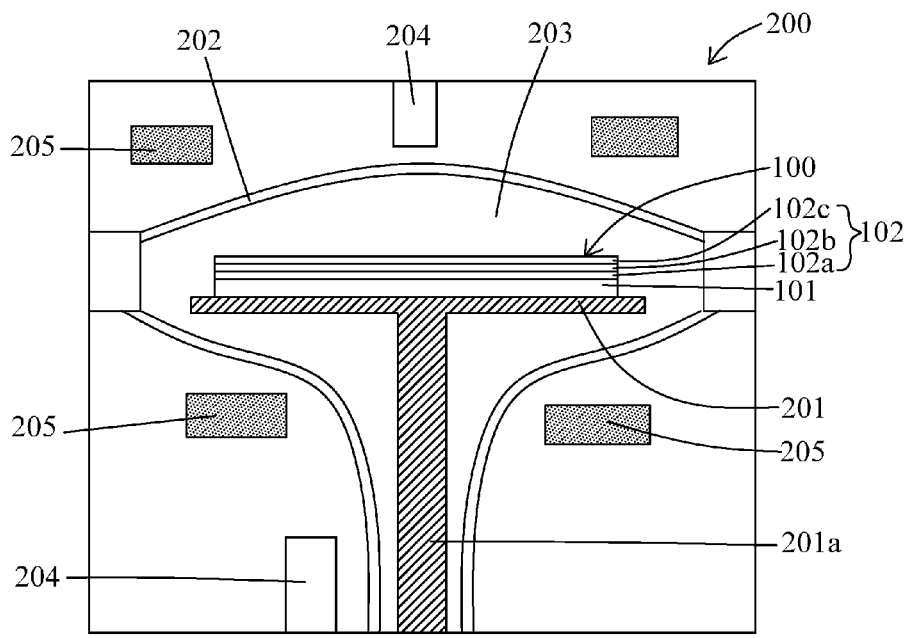
Figure 5K:
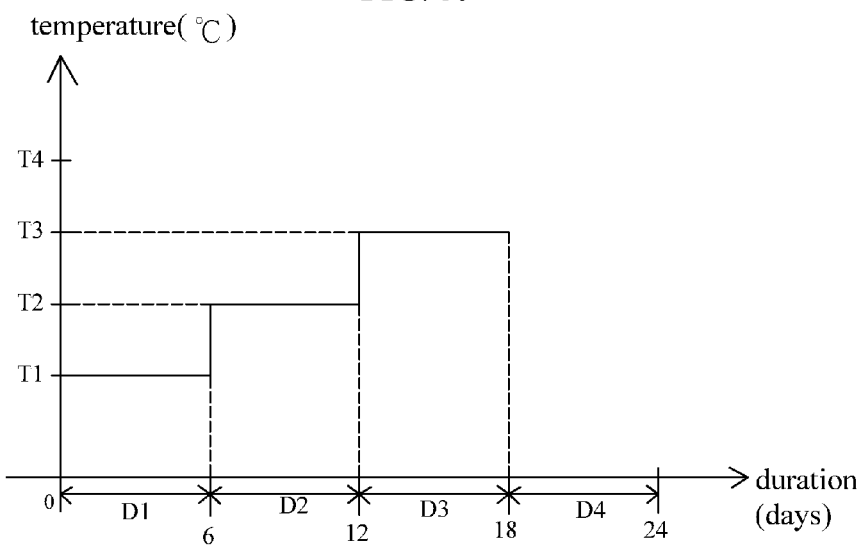

In operation 304, a third semiconductive material 102c is disposed over the second semiconductive material 102b at a third temperature T3 as shown in FIGS. 5I-5K. FIG. 5I is an enlarged view of the substrate 101, the first semiconductive material 102a, the second semiconductive material 102b and the third semiconductive material 102c in FIG. 5J. FIG. 5K is a graph showing the third temperature T3 is maintained within a certain period of time during the disposing of the third semiconductive material 102c. In some embodiments, the third semiconductive material 102c is grown over the second semiconductive material 102b at the third temperature T3. In some embodiments, the substrate 101, the first semiconductive material 102a or the second semiconductive material 102b is adjusted to the third temperature T3, and then the third semiconductive material 102c is grown over the second semiconductive material 102b at the third temperature T3. In some embodiments, the disposing or growing of the second semiconductive material 102b is immediately followed by the disposing or growing of the third semiconductive material 102c. In some embodiments, the third semiconductive material 102c is disposed by any suitable operations such as VPE, CVD, etc.

In some embodiments, the third semiconductive material 102c includes silicon. In some embodiments, the third semiconductive material 102c is a third epitaxial layer or a third silicon epitaxial layer. In some embodiments, the third semiconductive material 102c includes same material as the first semiconductive material 102a or the second semiconductive material 102b. In some embodiments, a growth rate of the third semiconductive material 102c is substantially same as a growth rate of the first semiconductive material 102a or a growth rate of the second semiconductive material 102b.

In some embodiments, a third thickness of the third semiconductive material 102c is substantially same as the first thickness of the first semiconductive material 102a or the thickness of the second semiconductive material 102b. In some embodiments, a deviation of a total thickness of the substrate 101, the first semiconductive material 102a, the second semiconductive material 102b and the third semiconductive material 102c across the substrate 101 or the semiconductor structure 100 is less than about 2 Å. In some embodiments, the total thickness of the substrate 101, the first semiconductive material 102a, the second semiconductive material 102b and the third semiconductive material 102c is uniform over the substrate 101. In some embodiments, the third semiconductive material 102c has similar configuration as described above or illustrated in FIG. 1 or 2. In some embodiments, the semiconductor structure 100 has similar configuration as described above or illustrated in FIG. 1 or 2. In some embodiments, an epitaxy layer 102 is formed after the operation 304.

In some embodiments, the third semiconductive material 102c is grown over the second semiconductive material 102b at the third temperature T3. In some embodiments, the substrate 101, the first semiconductive material 102a or the second semiconductive material 102c is adjusted from the second temperature T2 to the third temperature T3, and then the third semiconductive material 102c is grown over the second semiconductive material 102b at the third temperature T3. In some embodiments, the second temperature T2 is adjusted to the third temperature T3, and then the third semiconductive material 102c is disposed over the second semiconductive material 102b at the third temperature T3. In some embodiments, the third temperature T3 is arrived by adjusting the source 205 of the processing chamber 200. In some embodiments, the second temperature T2 is adjusted to the third temperature T3 by increasing or decreasing a temperature of about 0.01° C. to about 0.5° C. In some embodiments, the second temperature T2 is adjusted to the third temperature T3 by increasing or decreasing a temperature of about 0.1° C.

In some embodiments, a second interval between the second temperature T2 and the third temperature T3 is substantially same as the first interval between the first temperature T1 and the second temperature T2. In some embodiments, the second interval between the second temperature T2 and the third temperature T3 is about 0.01° C. to about 0.5° C. In some embodiments, the second interval between the second temperature T2 and the third temperature T3 is about 0.1° C. In some embodiments, the third temperature T3 is substantially greater than the second temperature T2. For example as shown in FIG. 3 or 5K, the second temperature T2 is about 670.1° C., and the third temperature T3 is about 670.2° C. The second temperature T2 is increased from about 670.1 t to the third temperature T3 of about 670.2° C. For example as shown in FIG. 4, the second temperature T2 is about 670.5° C., and the third temperature T3 is about 671° C. The second temperature T2 is increased from 670.5° C. to the third temperature T3 of about 671° C.

In some embodiments, the third semiconductive material 102c is disposed over the second semiconductive material 102b at the third temperature T3 for a third duration D3. In some embodiments, the disposing of the third semiconductive material 102c at the third temperature T3 lasts for the third duration D3. In some embodiments, the substrate 101, the first semiconductive material 102a or the second semiconductive material 102c is adjusted from the second temperature T2 to the third temperature T3, and then the third semiconductive material 102c is grown over the second semiconductive material 102b at the third temperature T3 for the third duration D3. In some embodiments, the third semiconductive material 102c is formed over the second semiconductive material 102b at the third temperature T3 after the second duration D2. In some embodiments, the third duration D3 is about 3 days to 10 days. In some embodiments, the third duration D3 is about 6 days.

In some embodiments, the third duration D3 is substantially same as the first duration D1 or the second duration D2. For example as shown in FIG. 3 or 5K, the first semiconductive material 102a is disposed for 6 days, the second semiconductive material 102b is disposed for 6 days, and the third semiconductive material 102b is also disposed for 6 days. For example as shown in FIG. 4, the first semiconductive material 102a is disposed for 1 month, the second semiconductive material 102b is disposed for 1 month, and the third semiconductive material 102c is also disposed for 1 month. In some embodiments, the third duration D3 is immediately after the second duration D2.

Figure 6:
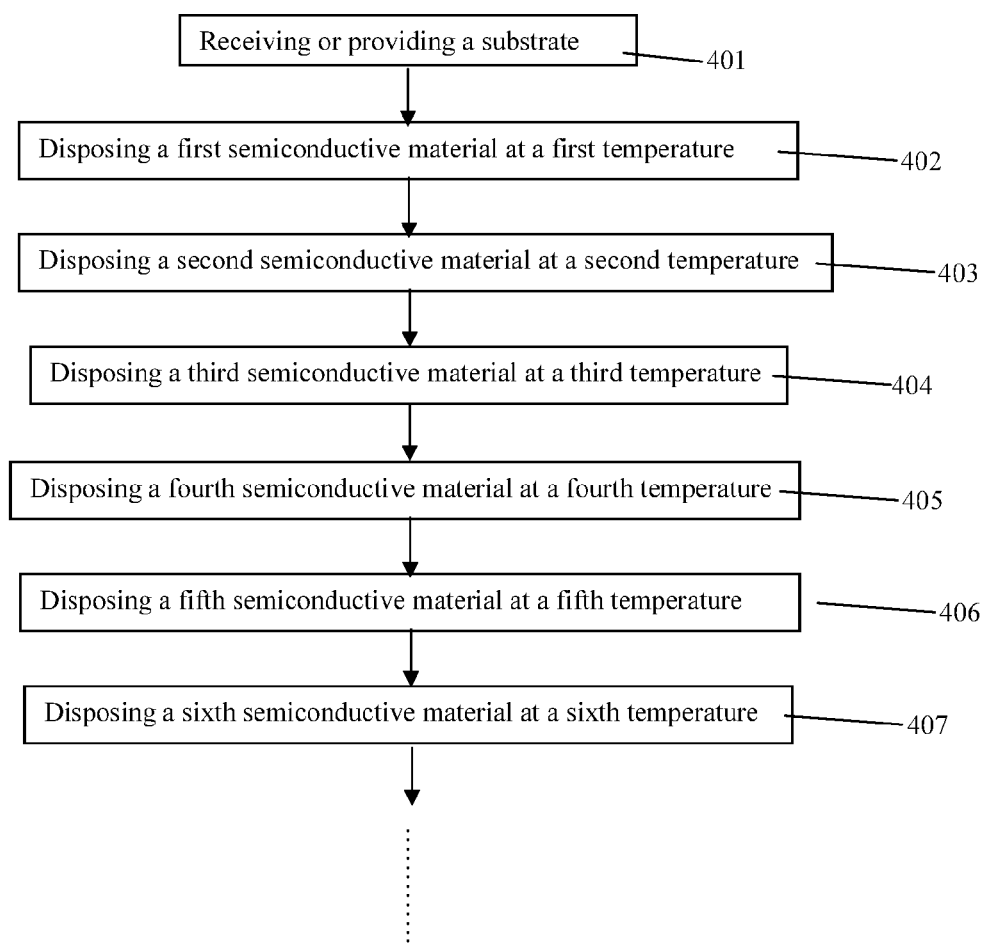
FIG. 6 is a flow diagram of a method of manufacturing a semiconductor structure in accordance with some embodiments of the present disclosure.
Figure 6A:
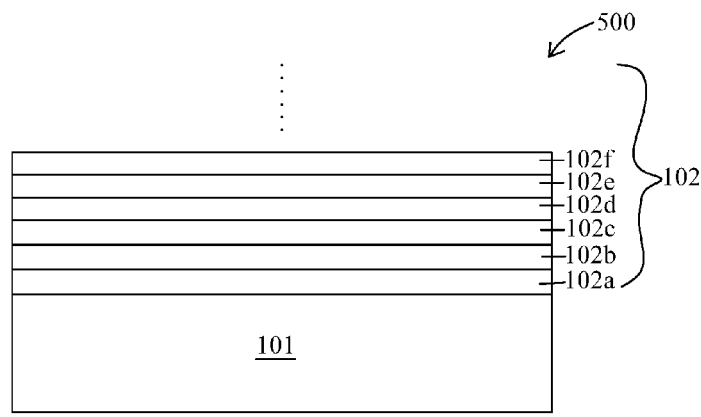
FIGS. 6A-6C are schematic views of manufacturing a semiconductor structure by a method of FIG. 6 in accordance with some embodiments of the present disclosure.
Figure 6B:
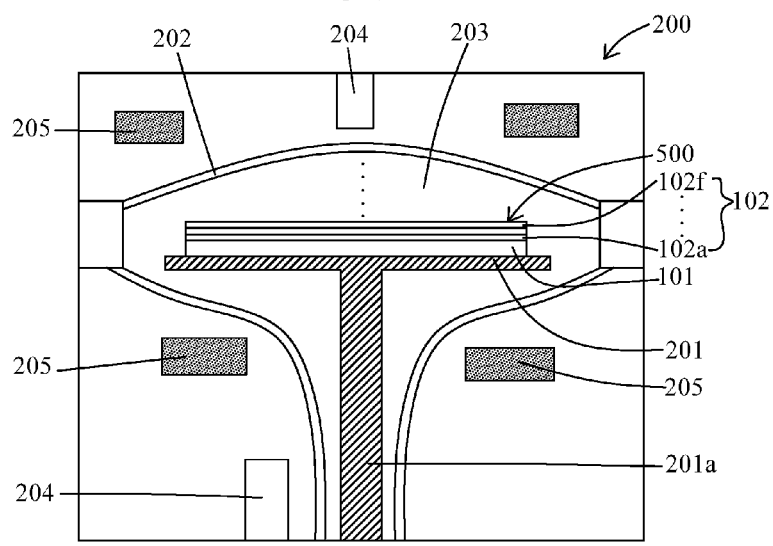
Figure 6C:
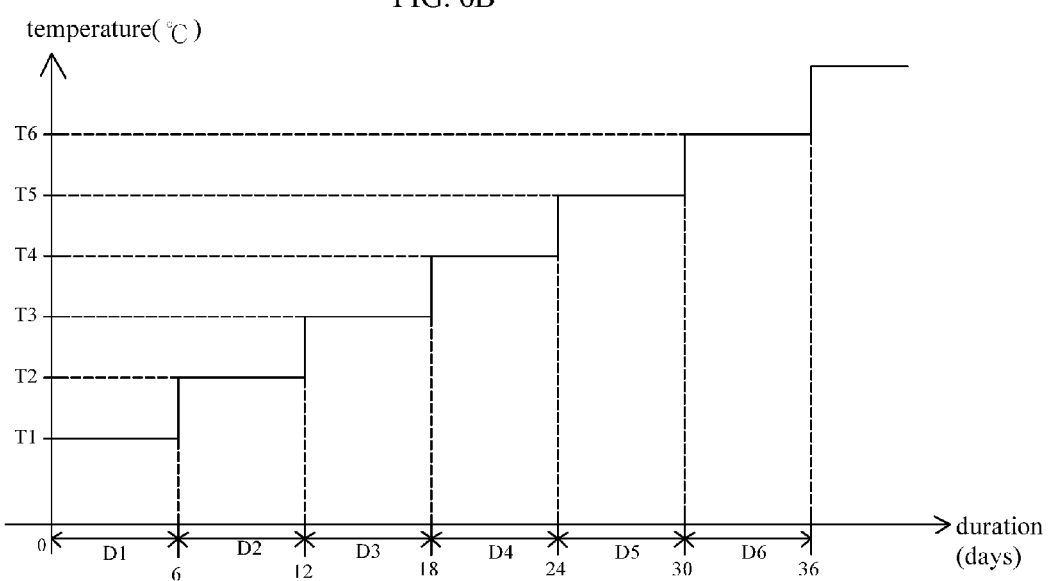

Referring to FIGS. 6A-6C, depositions of semiconductive materials (102a-102f) over each other are performed repeatedly under a constant increase or decrease of temperature. As a result, the epitaxial layer 102 with uniform thickness over the substrate 101 is formed, or a deviation of total thickness of a semiconductor structure 500 across the semiconductor structure 500 is less than about 2 Å. In some embodiments, the semiconductor structure 500 is formed by a method 400 as shown in FIG. 6. In some embodiments, operations 401-404 in FIG. 6 are similar to the operations 301-304 in FIG. 5 respectively.

In some embodiments, a fourth semiconductive material 102d is disposed over the third semiconductive material 102c at a fourth temperature T4 over a fourth duration D4 during an operation 405. In some embodiments, a fifth semiconductive material 102e is disposed over the fourth semiconductive material 102d at a fifth temperature T5 over a fifth duration D5 during an operation 406. In some embodiments, a sixth semiconductive material 102f is disposed over the fifth semiconductive material 102e at a sixth temperature T6 over a sixth duration D6 during an operation 407.

In some embodiments, a difference between the fourth temperature T4 and the third temperature T3, a difference between the fifth temperature T5 and the fourth temperature T4, and a difference between the sixth temperature T6 and the fifth temperature T5 are substantially the same. In some embodiments, the fourth duration D4, the fifth duration D5 and the sixth duration D6 are substantially the same. In some embodiments, the operation 404 is immediately followed by the operation 405, the operation 405 is immediately followed by the operation 406, the operation 406 is immediately followed by the operation 407. In some embodiments, depositions of semiconductive materials are repeated until the epitaxial layer 102 is formed with a desired thickness.

A method of manufacturing a semiconductor structure is disclosed. The method includes disposing semiconductive material over a substrate with periodical adjustment of temperature. For example, the temperature would be increased about 0.1° C. every 6 days. Such periodical adjustment of temperature would result in the semiconductive material disposed in a uniform thickness over the substrate, a deviation of total thickness of the semiconductor structure across the semiconductor structure less than about 2 Å, formation of stable epitaxial layer over the substrate, and continuous deposition of the semiconductive material over the substrate.

In some embodiments, a method of manufacturing a semiconductor structure includes providing a substrate, disposing a first semiconductive material over the substrate at a first temperature, disposing a second semiconductive material over the first semiconductive material at a second temperature, and disposing a third semiconductive material over the second semiconductive material at a third temperature, wherein a first interval between the first temperature and the second temperature is substantially same as a second interval between the second temperature and the third temperature.

In some embodiments, the disposing the first semiconductive material is immediately followed by the disposing the second semiconductive material, or the disposing the second semiconductive material is immediately followed by the disposing the third semiconductive material. In some embodiments, the first interval or the second interval is about 0.01° C. to about 0.5° C. In some embodiments, the first interval or the second interval is about 0.1° C. In some embodiments, the first temperature is adjusted to the second temperature by increasing or decreasing a temperature of about 0.01° C. to about 0.5° C., or the second temperature is adjusted to the third temperature by increasing or decreasing a temperature of about 0.01° C. to about 0.5° C. In some embodiments, the first temperature is adjusted to the second temperature by increasing or decreasing a temperature of about 0.1° C., or the second temperature is adjusted to the third temperature by increasing or decreasing a temperature of about 0.1° C. In some embodiments, the second temperature is substantially greater than the first temperature. In some embodiments, the third temperature is substantially greater than the second temperature or the first temperature. In some embodiments, the disposing the first semiconductive material at the first temperature lasts for a first duration, and the disposing the second semiconductive material at the second temperature lasts for a second duration, and the first duration is substantially same as the second duration. In some embodiments, the first duration and the second duration are about 6 days respectively. In some embodiments, a first thickness of the first semiconductive material, a second thickness of the second semiconductive material, and a third thickness of the third semiconductive material are substantially same as each other.

In some embodiments, a method of manufacturing a semiconductor structure includes disposing a substrate inside a chamber, adjusting the substrate to a first temperature, forming a first epitaxial layer over the substrate at the first temperature for a first duration, adjusting the substrate and the first epitaxial layer from the first temperature to a second temperature, forming a second epitaxial layer over the first epitaxial layer at the second temperature for a second duration, and adjusting the substrate, the first epitaxial layer and the second epitaxial layer from the second temperature to a third temperature, wherein the first duration is substantially same as the second duration, and a first interval between the first temperature and the second temperature is substantially same as a second interval between the second temperature and the third temperature.

In some embodiments, a deviation of a total thickness of the substrate, the first epitaxial layer and the second epitaxial layer across the semiconductor structure is less than about 2 Å. In some embodiments, the method further includes forming a third epitaxial layer over the second epitaxial layer at the third temperature for a third duration, wherein the third duration is substantially same as the first duration or the second duration. In some embodiments, a deviation of a total thickness of the substrate, the first epitaxial layer, the second epitaxial layer and the third epitaxial layer across the semiconductor structure is less than about 2 Å. In some embodiments, the substrate, the first epitaxial layer and the second epitaxial layer include silicon. In some embodiments, the first temperature or the second temperature is arrived by adjusting an infra red (IR) source disposed inside or outside the chamber.

In some embodiments, a method of manufacturing a semiconductor structure includes providing a silicon substrate, growing a first silicon epitaxial layer over the silicon substrate at a first temperature for a first duration, and growing a second silicon epitaxial layer over the first silicon epitaxial layer at a second temperature for a second duration, wherein the first duration is substantially same as the second duration, and an interval between the first temperature and the second temperature is about 0.01° C. to about 0.5° C.

In some embodiments, a growth rate of the first silicon epitaxial layer is substantially same as a growth rate of the second silicon epitaxial layer. In some embodiments, the growing the first silicon epitaxial layer is immediately followed by the growing the second silicon epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a substrate;
   disposing a first silicon epitaxial layer over the substrate at a first temperature;
   disposing a second silicon epitaxial layer over the first silicon epitaxial layer at a second temperature higher than the first temperature and maintained during the entire disposition of the second silicon epitaxial layer; and
   disposing a third silicon epitaxial layer over the second silicon epitaxial layer at a third temperature,
   wherein a first interval between the first temperature and the second temperature is substantially same as a second interval between the second temperature and the third temperature; and
   wherein the first silicon epitaxial layer, the second silicon epitaxial layer, and the third silicon epitaxial layer are composed of a same material.

2. The method of claim 1, wherein the disposing the first silicon epitaxial layer is immediately followed by the disposing the second silicon epitaxial layer, or the disposing the second silicon epitaxial layer is immediately followed by the disposing the third silicon epitaxial layer.

3. The method of claim 1, wherein the first interval or the second interval is about 0.01° C. to about 0.5° C.

4. The method of claim 1, wherein the first interval or the second interval is about 0.1° C.

5. The method of claim 1, wherein the first temperature is adjusted to the second temperature by increasing or decreasing a temperature of about 0.01° C. to about 0.5° C., or the second temperature is adjusted to the third temperature by increasing or decreasing a temperature of about 0.01°C. to about 0.5°C.

6. The method of claim 1, wherein the first temperature is adjusted to the second temperature by increasing or decreasing a temperature of about 0.1° C., or the second temperature is adjusted to the third temperature by increasing or decreasing a temperature of about 0.1° C.

7. The method of claim 1, wherein the second temperature is substantially greater than the first temperature.

8. The method of claim 1, wherein the third temperature is substantially greater than the second temperature or the first temperature.

9. The method of claim 1, wherein the disposing the first silicon epitaxial layer at the first temperature lasts for a first duration, and the disposing the second silicon epitaxial layer at the second temperature lasts for a second duration, and the first duration is substantially same as the second duration.

10. The method of claim 9, wherein the first duration and the second duration are about 6 days respectively.

11. The method of claim 1, wherein a first thickness of the first silicon epitaxial layer, a second thickness of the second silicon epitaxial layer, and a third thickness of the third silicon epitaxial layer are substantially same as each other.

12. A method of manufacturing a semiconductor structure, comprising:
   disposing a substrate inside a chamber;
   adjusting the substrate to a first temperature;
   forming a first silicon epitaxial layer over the substrate at the first temperature for a first duration;
   adjusting the substrate and the first silicon epitaxial layer from the first temperature to a second temperature;
   forming a second silicon epitaxial layer over the first silicon epitaxial layer at the second temperature for a second duration; and
   adjusting the substrate, the first silicon epitaxial layer and the second silicon epitaxial layer from the second temperature to a third temperature,
   wherein the first duration is substantially same as the second duration, and a first interval between the first temperature and the second temperature is substantially same as a second interval between the second temperature and the third temperature, the first interval and the second interval are about 0.01° C. to about 0.5° C. respectively, wherein adjusting the first temperature to the second temperature, and adjusting the second temperature to the third temperature are performed within 3 months.

13. The method of claim 12, wherein a deviation of a total thickness of the substrate, the first silicon epitaxial layer and the second silicon epitaxial layer across the semiconductor structure is less than about 2Å.

14. The method of claim 12, further comprising forming a third silicon epitaxial layer over the second silicon epitaxial layer at the third temperature for a third duration, wherein the third duration is substantially same as the first duration or the second duration.

15. The method of claim 14, wherein a deviation of a total thickness of the substrate, the first silicon epitaxial layer, the second silicon epitaxial layer and the third silicon epitaxial layer across the semiconductor structure is less than about 2Å.

16. The method of claim 12, wherein the first temperature or the second temperature is arrived by adjusting an infra red (IR) source disposed inside or outside the chamber.

17. A method of manufacturing a semiconductor structure, comprising:

providing a silicon substrate;

increasing a temperature of the silicon substrate from a first temperature to a second temperature every 6 days;

growing a first silicon epitaxial layer over the silicon substrate at the first temperature for a first duration; and growing a second silicon epitaxial layer over the first silicon epitaxial layer at the second temperature for a second duration, wherein the first duration is substantially same as the second duration, and an interval between the first temperature and the second temperature is about 0.1° C.

18. The method of claim 17, wherein a growth rate of the first silicon epitaxial layer is substantially the same with a growth rate of in the second silicon epitaxial layer.

19. The method of claim 17, wherein the growing the first silicon epitaxial layer is immediately followed by the growing the second silicon epitaxial layer.

* * * * *